(12) United States Patent
Mangano et al.

(10) Patent No.: US 10,082,824 B2
(45) Date of Patent: Sep. 25, 2018

(54) METHOD AND DEVICE FOR CLOCK CALIBRATION AND CORRESPONDING APPARATUS

(71) Applicant: STMICROELECTRONICS S.R.L., Agrate Brianza (IT)

(72) Inventors: Daniele Mangano, San Gregorio di Catania (IT); Riccardo Condorelli, Tremestieri Etneo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/965,002

(22) Filed: Dec. 10, 2015

(65) Prior Publication Data

US 2016/0246324 A1    Aug. 25, 2016

(30) Foreign Application Priority Data

Feb. 20, 2015    (IT) .............................. TO2015A0117

(51) Int. Cl.
| | |
|---|---|
| *G06F 1/12* | (2006.01) |
| *G06F 1/14* | (2006.01) |
| *H03L 1/00* | (2006.01) |
| *G06F 1/32* | (2006.01) |

(52) U.S. Cl.
CPC .................. *G06F 1/12* (2013.01); *G06F 1/14* (2013.01); *G06F 1/3243* (2013.01); *H03L 1/00* (2013.01); *Y02D 10/152* (2018.01)

(58) Field of Classification Search
None
See application file for complete search history.

(56) References Cited

U.S. PATENT DOCUMENTS

| | | | | |
|---|---|---|---|---|
| 4,602,375 | A  * | 7/1986 | Inukai .................. | H04B 7/2048 370/324 |
| 7,860,205 | B1 * | 12/2010 | Aweya .................... | H03L 7/093 370/497 |
| 2005/0153751 | A1* | 7/2005 | Bultan .............. | H04W 52/0248 455/574 |
| 2005/0195105 | A1 | 9/2005 | McBurney et al. | |
| 2007/0035353 | A1* | 2/2007 | Chapin .................... | G04G 3/04 331/176 |
| 2008/0222440 | A1* | 9/2008 | Jones ........................ | G06F 1/14 713/400 |
| 2010/0295623 | A1 | 11/2010 | Gronemeyer | |
| 2011/0134766 | A1* | 6/2011 | Zampetti ............... | H04J 3/0682 370/252 |
| 2011/0145623 | A1* | 6/2011 | May ...................... | G06F 1/3203 713/503 |

(Continued)

*Primary Examiner* — Kim Huynh
*Assistant Examiner* — Danny Chan
(74) *Attorney, Agent, or Firm* — Slater Matsil, LLP (57) ABSTRACT

A clock generator includes a microcontroller unit calibrated by aligning at subsequent calibration times a frequency of a first clock with respect to the frequency of a second clock having a higher frequency accuracy than the first clock, with the frequency of the first clock varying between subsequent calibration times. The frequency of the first clock is aligned to a frequency which is offset by a certain amount with respect to the frequency of the second clock to counter frequency error which may accumulate over time due to the variation in the frequency of the first clock.

21 Claims, 4 Drawing Sheets

(56) References Cited

U.S. PATENT DOCUMENTS

| | | | |
|---|---|---|---|
| 2011/0204945 A1* | 8/2011 | Wagner | G06F 1/14 327/160 |
| 2012/0030495 A1* | 2/2012 | Chandhoke | G06F 1/10 713/400 |
| 2012/0166121 A1* | 6/2012 | Yang | H03K 5/00006 702/79 |
| 2014/0139293 A1* | 5/2014 | Tsangaropoulos | H03L 1/022 331/48 |
| 2015/0215031 A1* | 7/2015 | Dalvi | H04W 56/0015 370/324 |

* cited by examiner

METHOD AND DEVICE FOR CLOCK CALIBRATION AND CORRESPONDING APPARATUS

TECHNICAL FIELD

The present disclosure relates to clock calibration in electronic devices, and, more particularly, to clock calibration by pseudo real time clock generation.

BACKGROUND

Energy consumption of microcontroller units (MCU) may be a significant factor in many applications, e.g. in battery-powered systems. In various applications, a MCU may be active for short time periods (for instance after a wake-up event) and switched to a low-power mode for the remaining time. When in a low-power mode, MCUs usually maintain the correct time and date.

Time and date may be used to wake-up a system at certain time intervals or may be exploited by the application itself. A hardware function in charge of maintaining time and date may be referred to as a Real-Time Clock (RTC). The consumption of a RTC may represent a significant portion of the overall system consumption when in low-power mode. Reducing RTC consumption may thus play a role in providing energy efficiency at the application level and improve battery duration.

Various microcontroller products may embed an RTC in association with functions such as, e.g., sensor sampling and management, metering, Internet of Things (IoT), and so on. General-purpose CPUs may also embed an RTC, but in that case power consumption may represent a less critical factor.

SUMMARY

While several clock recovery/calibration solutions exist, the need is still felt for arrangements providing improved accuracy and the capability of RTC calibration, for example.

One or more embodiments may appreciably reduce RTC consumption by making it possible to run an RTC with low power consumption.

One or more embodiments may rely on a first clock generator with reduced power requirements in combination with a second, more accurate clock generator which may be used to periodically calibrate the first clock generator and back-correct errors associated with operation of the first clock generator.

In a particular embodiment a method of calibrating a clock generator may include aligning at subsequent calibration times, the frequency of a first clock with respect to the frequency of a second clock having a higher frequency accuracy than the first clock. The frequency of the first clock may vary between subsequent calibration times. The method may also include aligning the frequency of the first clock to a frequency offset by a certain amount with respect to the frequency of the second clock to counter the variation in the frequency of the first clock.

In another embodiment, a device for calibrating a clock generator may be configured for aligning at subsequent calibration times, the frequency of a first clock with respect to the frequency of a second clock having a higher frequency accuracy than the first clock. The frequency of the first clock may vary between subsequent calibration times. The device may also be configured for aligning the frequency of the first clock to a frequency offset by a certain amount with respect to the frequency of the second clock to counter the variation in the frequency of the first clock.

BRIEF DESCRIPTION OF THE DRAWINGS

One or more embodiments will now be described, purely by way of non-limiting example, with reference to the annexed figures, wherein.

DETAILED DESCRIPTION

In the ensuing description one or more specific details are illustrated, aimed at providing an understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Figure 1:
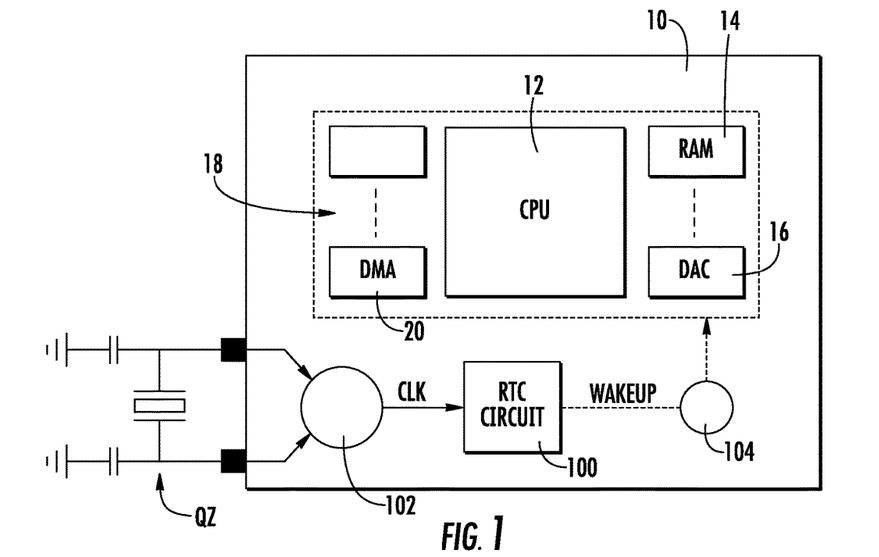
FIG. 1 is an exemplary block diagram of an apparatus including a Real Time Clock (RTC) implementation.

FIG. 1 shows an exemplary arrangement of a MicroController Unit (MCU) 10 embedding a Real Time Clock (RTC) facility.

The MCU arrangement 10 exemplified in FIG. 1 includes a Central Processing Unit (CPU) 12 having associated therewith various circuitry such as e.g. a RAM memory 14, a Digital-to-Analog Converter (DAC) 16, associated registers 18 and a DMA facility 20 allowing a peripheral to write and read memory without intervention by the CPU 12.

This arrangement is purely exemplary and shall not be construed, even indirectly, as limitative of the embodiments. Such an arrangement is intended to be generally exemplary of an arrangement where certain elements/components (such as those designated 12 to 20 in FIG. 1) may be switched to a low-power mode (briefly: "switched off") to reduce electrical power consumption.

In an arrangement as exemplified in FIG. 1 a Real Time Clock (RTC) facility may be implemented through a dedicated digital circuit 100 to which a "reliable" clock signal is input from a clock generator 102.

The MCU arrangement 10 may be configured (in a manner known per se) in such a way that in one or more low-power modes supported thereby, the RTC circuit 100 and the clock generation circuit 102 are active while the other components are "off". The RTC circuit itself 100 may be used to wake-up the system e.g. via a control unit 104.

A MCU arrangement 10 as exemplified herein may be adopted, for example, in order to minimize power consumption while sampling a sensor at a given rate.

An adequate level of accuracy (e.g. in terms of reduced time drift) may be obtained with a clock signal provided to the RTC circuit 100 which is by itself accurate. For instance, crystal-based clock generation QZ may be associated with the arrangement 10.

Consumption of the clock generation system (e.g. 100, 102) may be observed to represent a significant portion of the MCU power consumption when in a low-power mode.

An approach in reducing power consumption of the clock generation system may involve using an "on-chip" RC oscillator. This may however lead to clock accuracy being inadequate to avoid errors in the RTC time/calendar.

One or more embodiments may reduce RTC power consumption by clocking the RTC circuit 100 via two clock sources, e.g.:

a first (e.g. internal) clock 106 having a low power absorption level and a correspondingly low degree of accuracy, and a second (e.g. external) clock 108, which is more accurate and high-consuming and may be used for periodically calibrating the RTC circuit 100 in order to compensate frequency drift and perform back-correction of the error accumulated in the first, low-accuracy/low-power clock 106.

The second high-accuracy/high-consuming clock 108 may be turned on only for the time involved in performing the calibration.

One or more embodiments may employ two self-calibration/self compensation facilities, e.g.:

Frequency Self-Calibration (FSC),

Error Self-Compensation (ESC).

The former (FSC) may have the aim of calibrating the RTC 100 with an external accurate clock source, while the latter (ESC) may have the aim of compensating error accumulated between two consecutive recalibrations.

In one or more embodiments, Frequency Self-Calibration (FSC) may be performed by means of a low-cost (power and area) circuit able to measure the frequency difference between the two clocks 106, 108 with an adequate precision.

One or more embodiments may take advantage of the availability of Error Self-Compensation (ESC) in order to achieve accuracy and avoid error accumulation even if only a first, less accurate clock (e.g. 106) is active most of the time, with a second, more accurate clock (e.g. 108) is not active.

Figure 2:
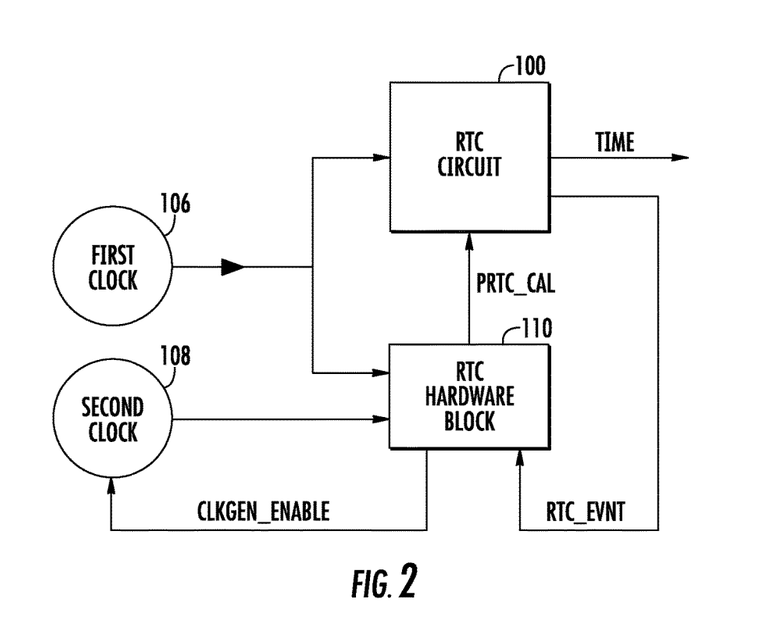
FIG. 2 is a functional block diagram exemplary of RTC implementation according to embodiments.

In one or more embodiments as exemplified in FIG. 2, a RTC hardware block 110 (implemented e.g., as a digital component) may be provided for implementing the two functions FSC and ESC.

To that effect, the block 110 may be sensitive to signals output by the clocks 106 and 108 and may control the Real Time Clock (RTC) 100 via a calibration signal prtc_cal. The block 110 may thus receive both clock signals generated by the clocks 106 and 108 and generate the calibration signal prtc_cal as a calibration word for use by the RTC 100.

In one or more embodiments as exemplified in FIG. 2, the RTC hardware block 110 may be clocked by the first, low-power clock 106.

In the exemplary context of use of MCUs, the first clock 106 and the second clock 108 may be called a LSI (Low-Speed Internal) and a LSE (Low-Speed External), respectively.

For illustration purposes the LSI and LSE clocks 106 and 108 may be assumed to operate at the same nominal frequency (e.g. 32 KHz), with the signal of the clock 106 exposed to frequency variation which may be countered by calibration on the basis of the (more accurate) signal of the clock 108.

Figure 3:
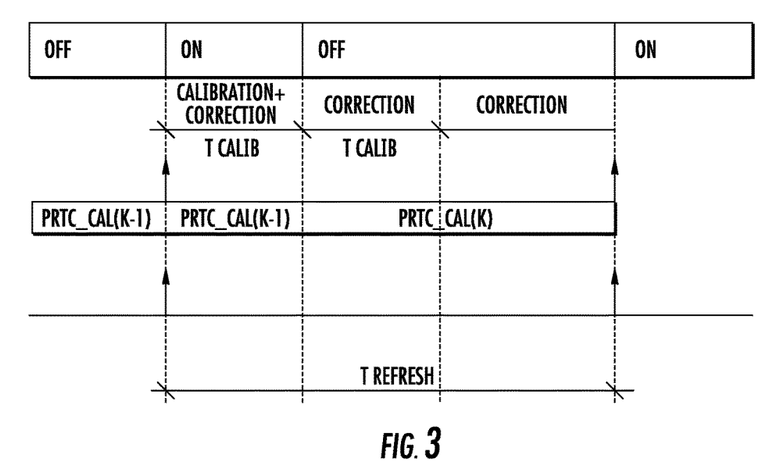
FIG. 3 is a time diagram exemplary of recalibration timing in the arrangement of FIG. 2.

As shown in the upper part of FIG. 3, the LSE clock 108 may be alternatively turned ON and OFF, with Trefresh being the separation interval between two consecutive calibration times (e.g. two subsequent turn ON events of the LSE clock 108) and Tcalib the calibration interval for performing a calibration, e.g. for generating an updated value for prtc_cal.

For illustration purposes, Trefresh may be assumed to be a multiple of Tcalib.

Turning the clock 108 on may be via an enable signal clkgen_enable sent by the RTC hardware block 110 over a corresponding line to the clock 108.

Intervention of the RTC hardware block 110 to trigger recalibration may be via a signal rtc_evnt sent over a corresponding line from the RTC 100 to the RTC hardware block 110.

In one or more embodiments, correction due to both FSC and ESC may not affect the LSI frequency directly and may be applied to the RTC 100 by means of the signal prtc_cal.

In one or more embodiments, the RTC 100 may generate a Time signal, which may convey time (hh:mm:ss) and date (e.g. calendar) information. For the sake of simplicity of this exemplary description, the RTC 100 may be regarded as a simple counter, which is incremented by 1 counting unit at each clock cycle of the first clock 106 (e.g. LSI).

In one or more embodiments, the RTC correction capability may involve one or more of the following:

correction is applied in a calibration window, i.e. in a time window of N cycles (e.g. $N=2^{32}$);

correction is expressed as number of pulses to be added or subtracted in the calibration window;

the number of pulses to be added/subtracted is specified by the signal prtc_cal;

when a calibration window is over, correction re-starts in a new time window using the updated value of prtc_cal (or the old value if it was not updated).

As highlighted in the diagram of FIG. 3, in one or more embodiments, correction may take place continuously over time, with e.g., a number of pulses specified via the signal prtc_cal added/subtracted by the RTC at each time window of a width Tcalib;

correction continued with the old value for prtc_cal during the calibration phase; and correction continued with an updated value for prtc_cal once calibration is terminated.

Such an approach makes it possible to perform a calibration with a precision of 1/N, e.g. 2.3 ppm in the exemplary case of e.g. $N=2^{32}$.

Figure 4:
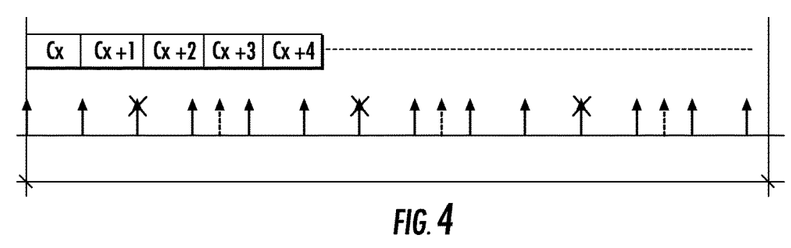
FIG. 4 is a time diagram exemplary of RTC calibration.

A possible RTC calibration mechanism is exemplified in FIG. 4, where black arrows indicate the time instants at which the RTC counter 100 is incremented in case of no correction.

Possible correction may be:

negative, e.g. with some of these arrows suppressed as indicated by an arrow being crossed out (no increment occurs), positive, e.g. with new arrows (in phantom lines) added between certain existing black arrows (the counter incremented more frequently).

In one or more embodiments the calibration time Tcalib (see FIG. 3), e.g. the time spent by the block 110 to generate the calibration word prtc_cal as a function of the clock signals from both the clocks 106, 108 may be equal to the calibration window. This does not represent a mandatory requirement but may facilitate implementing the circuit as it avoids hardware complexity possibly related to adapting the calibration word (prtc_cal) generated by the PRT calibration block 110 to the calibration word expected by the RTC 100.

It will otherwise be appreciated that, in one or more embodiments, the final result corresponds to correcting the clock frequency of the first clock (e.g. LSI) 106 even if the correction is in fact applied to the RCT counter 100.

Figures 5, 6:
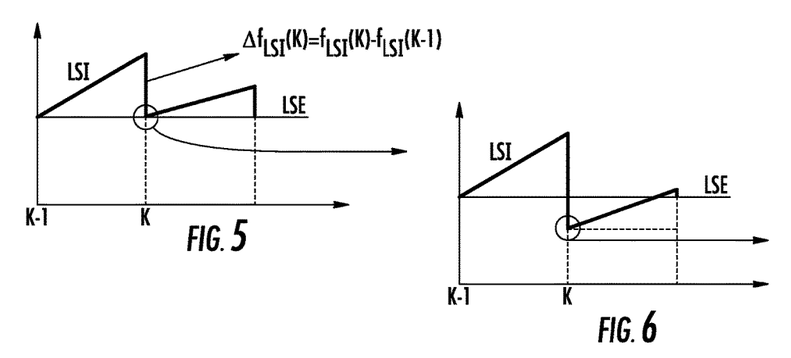
FIGS. 5 and 6 are time diagrams exemplary of clock correction.

FIG. 5 is a schematic representation of the effect of Frequency Self-Calibration (FSC) at calibration event K, e.g. aligning the frequency of the clock 106 (e.g. LSI) to the one of the clock 108 (e.g. LSE), with the RTC error Error(k) between calibration K−1 and calibration K basically corresponding to the integral of the frequency difference fLSI(K)−fLSI(K−1) between times K and K−1, e.g.:

$$\text{Error}(K) = (\Delta fLSI(K)/2) * Trefresh, \text{ where}$$

$$\Delta fLSI(K) = fLSI(K) - fLSI(K-1).$$

Whatever the frequency of the clock 106 at time K−1, no contribution to the error may be introduced thanks to Frequency Self-Calibration (each calibration essentially acts by aligning the LSI clock 106 to the LSE clock 108).

The frequency variation since the last calibration may be the source of an error introduced between consecutive calibrations, which may produce a non-negligible accumulated error over time.

The issue related to such an accumulated error may be addressed by Error Self-Compensation (ESC) by using the frequency difference between the two clocks 106, 108 (e.g. LSI and LSE) also to apply a back correction during the new calibration.

FIG. 6 is a schematic representation, along the lines of the representation of FIG. 5, of the possibility of implementing Error Self-Compensation (ESC) by correcting the frequency for the clock 106 (e.g. LSI) to a frequency which is offset (e.g. lower) with respect to the nominal frequency for the clock 108 (e.g. LSE) in order to compensate the above error.

The diagrams of FIGS. 5 and 6 refer to a frequency variation for the clock 106 in the direction of a frequency increase. Consequently correction of the frequency for the clock 106 (e.g. LSI) is to a frequency e.g. lower than the nominal frequency for the clock 108. It will be otherwise appreciated that correction of the frequency for the clock 106 may be to a frequency higher than the nominal frequency for the clock 108 in case the frequency variation for the clock 106 is in the direction of a decreased frequency.

For instance, in one or more embodiments an amount −ΔfLSI(K)/2 will be able to compensate, between K and K+1, the error collected between K−1 and K.

Assuming, e.g., that the frequency of the clock 106 (e.g. LSI) changes linearly, there will be no error accumulation regardless of the time elapsed since at each time the error will be essentially due to the frequency change since the last calibration with no contributions from previous calibrations.

Error Self-Compensation may efficiently back correct errors under the assumption of a linear frequency change for the clock 106 (e.g. LSI as exemplified in FIG. 5). In practical cases Error Self-Compensation will be effective even if the frequency change is not exactly linear because over small periods the frequency change will be well approximated by a linear relationship.

Moreover, if the frequency variation function (of the clock 106) as a function of e.g. temperature, voltage, and so on is known in advance (e.g. as a generic function freq_lsi=f(x,y,z)), the error due to the non-linearity can be compensated as in the linear case, e.g. by relying on some kind of sensing of the parameters likely to produce the change (e.g. temperature, voltage, . . . ).

In one or more embodiments, the calibration interval Tcalib after which the clock 108 is turned off may correspond to the time the clock 108 (e.g. LSE) is on over the entire period Trefresh (i.e. the separation interval separating two subsequent turn on events of the second clock 108), and the ratio Tcalib/Trefresh may be judiciously reduced (e.g. to less than 10) in order to minimize power consumption. For example, Tcalib/Trefresh=1/15 can be achieved with Trefresh~2 minutes and Tcalib~8 secs.

Figure 7:
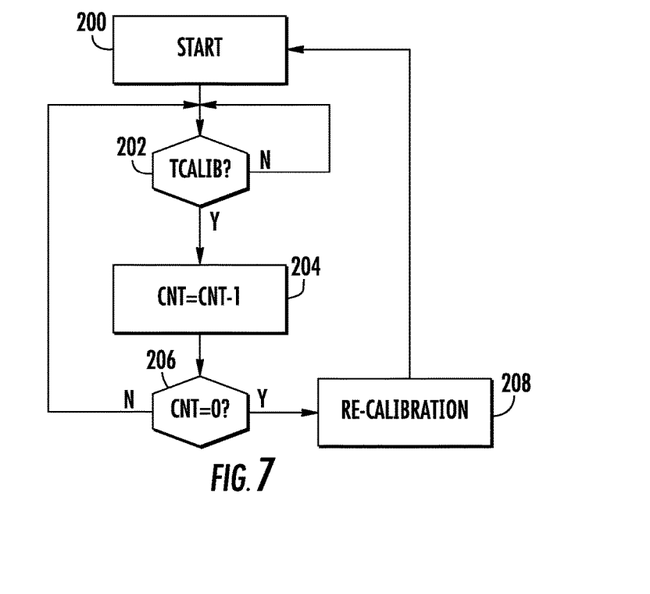
FIG. 7 is a flow chart exemplary of re-calibration triggering.

The flow chart in FIG. 7 is exemplary of a procedure for performing calibration after a time Trefresh.

After a start step 200 where e.g. the number of RTC cycles may be set (e.g. CNT=K), in a step 202 a check will be made as to whether a calibration window (having a duration Tcalib) is over based on a signal provided by the RTC 100.

A negative outcome (e.g. N) of the step 202 will indicate that the time Tcalib has not lapsed yet, and the system will loop back upstream of the step 202 to perform a further check on Tcalib after a certain time delay.

A positive outcome (e.g. Y) of the step 202 will indicate that the time Tcalib has lapsed and that the calibration window is over. The count for CNT will then be decreased by one count unit (e.g. CNT=CNT−1) in a step 204 and in a step 206 a check will be made as to whether CNT has reached a zero value.

A negative outcome (e.g. N) of the step 206 will indicate that CNT is not equal to zero yet, and the system will loop back upstream of the step 202 to repeat the step 202, 204 starting from a value for CNT decreased by a count unit (e.g. decreased by one).

A positive outcome (e.g. Y) of the step 206 will indicate that CNT is now equal to zero, and the system will evolve to a re-calibration step 208 and then loop back to the step 200.

According to the procedure exemplified in FIG. 7, Trefresh=(K+1)*Tcalib.

Figure 8:
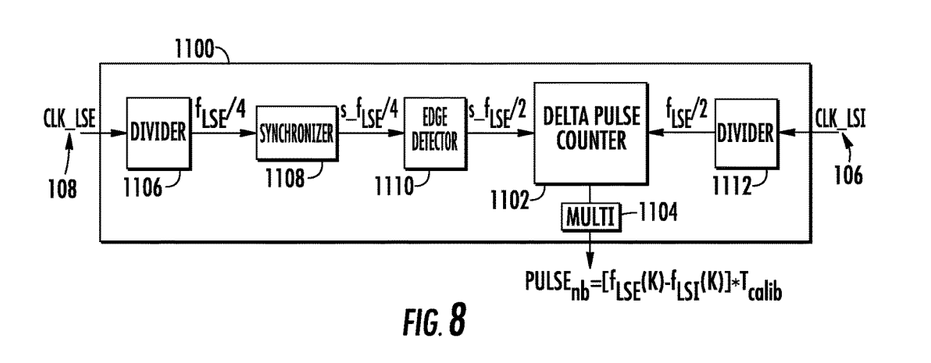
FIG. 8 is a block diagram of an exemplary Frequency Self-Calibration (FSC) engine.

The block diagram of FIG. 8 is exemplary of an engine 1100 for implementing Frequency Self-Calibration (FSC), based on clock signals clk_lsi and clk_lse received from the clocks 106 and 108, respectively.

The engine exemplified in FIG. 8 may measure the number of pulses to be added or subtracted in a calibration window. The number of pulses may be measured (notionally, at least) counting over a time window Tcalib the number of pulses of the clock 108 (e.g. LSE) and the number of pulses of the clock 106 (e.g. LSI) and calculating the difference.

One or more embodiments may recognize that the two clocks 108, 106 (e.g. LSE and LSI) may be asynchronous with respect to each other so that a sort of synchronization mechanism may be considered.

In one or more embodiments, an FSC engine 1100 may include a delta pulse counter 1102 which may measure the difference between the number of the pulses of the clock 108 (e.g. LSE) and the number of the pulses of the clock 106 (e.g. LSI).

For instance, in a time window including a number of cycles of the clock 106 (briefly LSI cycles) equal to Tcalib, such a counter may be decremented Tcalib/2 times (half the number of the LSI pulses) and incremented M times, where M is half of the number of the pulses of the clock 108 (briefly LSE pulses) in the same time window.

A multiplier 1104 (e.g. by 2) at the output of the counter 1102 may produce a value corresponding to [fLSE(K)−fLSI(K)]*Tcalib.

In one or more embodiments, in order to detect the variations in LSE (falling edges and rising edges of the LSE pulses) despite synchronization, the LSE frequency (i.e. the signal clk_lse from the clock 108) may be divided e.g. by 4 (/4 ACNT) in a divider 1106 and then synchronized in a synchronizer 1108, e.g. according to a traditional brute force approach (a chain of 2 D flip-flops may be an exemplary means for that purpose). For instance, the signal clk_lse/4 may be synchronized with clk_lsi, e.g. with the flip-flops of a brute force synchronizer receiving clk_lsi as the clock signal.

While division by 4 may lead to no signal changes being lost, in one or more embodiments a different solution may be adopted, such as e.g. a division by 2, optionally by using a synchronizer working on both clock edges (rising and falling), not unlike having a clock frequency twice the LSI frequency.

In one or more embodiments, an Edge Detector 1110 cascaded to the synchronizer 1008 may generate one pulse each time a variation (rising or falling) occurs in the input signal, thus multiplying by 2 the input frequency to produce at is output a synchronized version of the LSE pulses with a frequency divided by 2 for feeding to the delta pulse counter 1102.

In one or more embodiments, the LSI frequency (i.e. the clk_lsi signal from the clock 106) may be divided e.g. by 2 (/2 ACNT) in a divider 1112 to be fed to the delta pulse counter 1102.

As exemplified in the foregoing, in the absence of Error Self-Compensation (ESC), an accumulated error will arise:

$$\text{Error }(1) = (\Delta fLSI(1)/2) * Trefresh$$

$$\text{Error }(2) = \text{Error }(1) + (\Delta fLSI(2)/2) * Trefresh$$

$$\ldots$$

$$\text{Error }(K) = \text{Error }(K-1) + (\Delta fLSI(K)/2) * Trefresh,$$

where the index K identifies the calibration cycle, with ΔfLSI(K)=fLSI(K)−fLSI(K−1) and Error (K) including all the errors accumulates in the previous steps and.

As indicated, in one or more embodiments, whatever the LSI frequency at time K−1, no contribution to the error will be introduced thanks to Frequency Self-Calibration (FSC) while, the frequency variation since the last calibration may produce an error, essentially corresponding to the integral of ΔfLSI(K) over the interval Trefresh.

According to the Error Self Compensation (ESC) function already described in the foregoing, a corrective amount may be added to the above formula:

$$\text{Error }(1) = (\Delta fLSI(1)/2) * Trefresh$$

$$\text{Error }(2) = \text{Error }(1) + (\Delta fLSI(2)/2) * Trefresh - \text{Error\_comp}(2)$$

$$\ldots$$

$$\text{Error }(K) = \text{Error }(K-1) + (\Delta fLSI(K)/2) * Trefresh - \text{Error\_comp}(K).$$

where Error_comp(K) = (ΔfLSI(K−1)/2)*Trefresh

In that way:

$$\text{Error }(1) = (\Delta fLSI(1)/2) * Trefresh$$

$$\text{Error }(2) = (\Delta fLSI(2)/2) * Trefresh$$

$$\ldots$$

$$\text{Error }(K) = (\Delta fLSI(K)/2) * Trefresh.$$

Thanks to Error Self Compensation, the error at time K will not result from the accumulation of all the errors at previous steps, but it is exclusively the error related to the step K.

In one or more embodiments, the target of removing the accumulated error may thus be met.

The equation above indicates that in the time Trefresh, a number of pulses equal to (ΔfLSI(K−1)/2)*Trefresh may be added to (or subtracted from, depending on the sign) the RTC counter 100.

Consequently, in one or more embodiments, the correction specified for the RTC 100 at the calibration step K may be:

Error_comp(K)=(ΔfLSI(K)/2)*Tcalib the correction being referred to the calibration window Tcalib.

In one or more embodiments, to achieve the correction at time K a proper correction word may be applied to the RTC 100 at the previous calibration cycle, which explains why ΔfLSI(K) rather than ΔfLSI(K−1) is used in the last formula above.

One or more embodiments may rely on effective approaches for computing the correction to be applied at time K and the difference ΔfLSI(K), being otherwise known that:

Error_comp(K)=(ΔfLSI(K)/2)*Tcalib, and

ΔfLSI(K)=fLSI(K)−fLSI(K−1).

Figure 9:
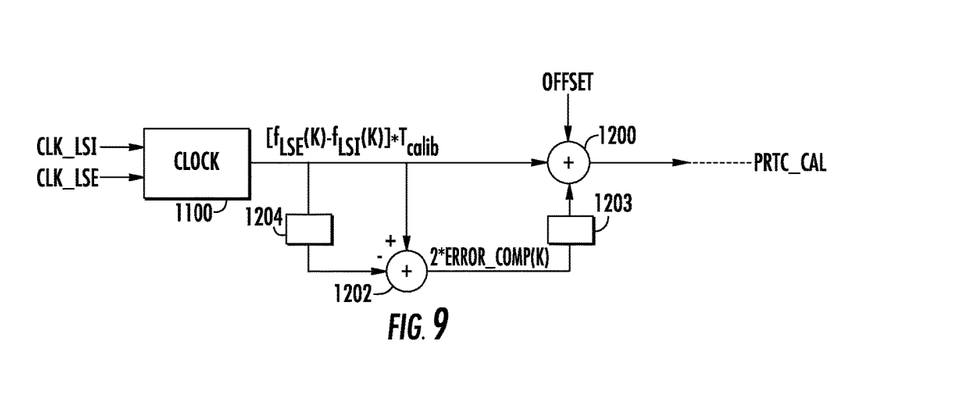
FIG. 9 is a block diagram of an exemplary combination of a FSC engine and an Error Self-Compensation (ESC) engine.

One such approach for computing prtc_cal as a result of both Frequency Self Calibration (FSC) and Error Self Compensation (ESC), e.g. following a correction previously applied is schematically represented in FIG. 9.

For instance, the block diagram of FIG. 9 shows an exemplary arrangement where the engine 1100 of FIG. 8 is configured to feed its output signal to a summation node 1200 which may produce the signal prtc_cal for feeding to the RTC 100 (see e.g. FIG. 2) by adding to the output of the clock 1100:

an (optional) Offset signal, and the signal Error_comp(K) produced by means of a summation node 1202 and a divider by two 1023 cascaded to the summation node 1202 which is fed with the output from the engine 1100 both in its "current" version and (with a negative sign) in its "earlier" version stored in a register 1204.

The Offset signal may be intended to perform a static calibration to optionally compensate a pre-defined frequency difference.

Assuming that the Offset signal is 0, the output prtc_cal from the summation node 1200 may be expressed as $$prtc\_cal=[fLSE\ (K)-fLSI(K)]*Tcalib+\{[fLSE(K)-fLSI(K)]*Tcalib-[fLSE(K-1)-fLSI(K-1)]\}*Tcalib\}/2=[fLSE(K)-fLSI(K)]*Tcalib-\{[fLSI(K)-fLSI(K-1)]*Tcalib\}/2=FSC\_output-Error\_comp,$$

which may also be rewritten as:

$$prtc\_cal[K]=[fLSE\ (K)-fLSI(K)]*Tcalib+\{[fLSE(K)-fLSI(K)]*Tcalib-[fLSE(K-1)-fLSI(K-1)]\}*Tcalib\}/2=$$

Since fLSE(K)=fLSE(K−1)(LSE may in fact be assumed to be stable)

$$=[fLSE(K)-fLSI(K)]*Tcalib-\{[fLSI(K)-fLSI(K-1)]*Tcalib\}/2==[fLSE(K)-fLSI(K)]*Tcalib-[\Delta fLSI(K)*Tcalib/2]$$

Since $$FSC\_output[K]=[fLSE(K)-fLSI(K)]*Tcalib$$

$$Error\_comp[K]=\Delta fLSI(K)*Tcalib/2$$

the formula above can be rewritten as follows:

$$prtc\_cal[K]=FSC\_output[K]-Error\_comp[K]$$

which is a useful result.

Figure 10:
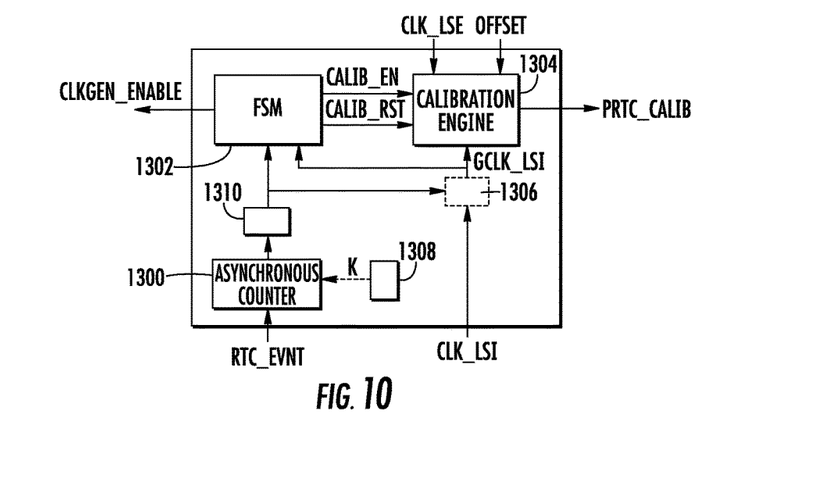
FIG. 10 is a block diagram of an exemplary Pseudo Real Time Clock (PRTC) architecture according to one or more embodiments.

A possible micro-architecture of the overall PRTC ctrl block 110 is exemplified in the block diagram of FIG. 10.

There, an asynchronous counter 1300 and a Finite State Machine FSM 1302 implement basically the procedure exemplified in FIG. 6, by receiving the signal rtc_evnt as an input and generating the signal clkgen_enable as an output (see FIG. 2).

In one or more embodiments a calibration engine 1304 may be included corresponding to the block diagram of FIG. 9 to produce the signal prtc_calib for feeding to the PRT 100.

Control signals calib_en and calib_rst from the FSM 1302 may aim at enabling the calibration engine (e.g. starting the counter and allow write to registers) and at resetting before starting a new calibration, respectively.

In order to reduce power consumption, a clock gating module 1306 may be provided acting on the clock signal clk_lsi from the clock 106 to produce a gated clock signal gclk_lsi for feeding to the FSM 1302 and the calibration engine 1304.

An (optionally programmable) value for K may be stored in a register 1308, while reference 1310 denotes a logical circuit for identifying the situation where the counter has reached a value equal to zero. For instance, the counter may be loaded with a value K and then decremented at each event rtc_event. When the counter reaches the value zero, the output from the block 1310 goes to "1" thus providing a start command for the Finite State Machine.

Without prejudice to the underlying principles, the details and embodiments may vary, even significantly, with respect to what is illustrated herein purely by way of non-limiting example, without thereby departing from the extent of protection.

The invention claimed is:

1. A method of calibrating a clock generator comprising: compensating for an accumulation error in a real time clock (RTC) circuit that receives a first clock, the compensating performed by aligning, at a plurality of calibration times, a frequency of the first clock to an overcompensated frequency to counter a variation in the frequency of the first clock, wherein the frequency of the first clock varies between each of the plurality of calibration times, and wherein the RTC circuit is configured to maintain time and date; and
determining the overcompensated frequency by adding a frequency offset to a frequency of a second clock having a higher frequency accuracy than the first clock, wherein the overcompensated frequency is different from the frequency of the second clock, and wherein an average of the frequency of the first clock between calibration times is different than the frequency of the second clock while compensating for the accumulation error.

2. The method of claim 1, further comprising turning on the second clock at the plurality of calibration times, wherein the plurality of calibration times are separated by separation intervals.

3. The method of claim 2, further comprising turning off the second clock after a calibration interval.

4. The method of claim 1, further comprising determining an amount of the frequency offset at a given calibration time as a function of the variation of the first clock over a calibration interval at the given calibration time as a function of a product of the variation of the first clock and the calibration interval.

5. The method of claim 1, wherein aligning the frequency of the first clock with respect to the frequency of the second clock comprises adding count pulses of the first clock over a calibration window.

6. The method of claim 1, wherein aligning the frequency of the first clock with respect to the frequency of the second clock comprises subtracting count pulses of the first clock over a calibration window.

7. The method of claim 1, further comprising determining an amount of the frequency offset at a given calibration time as a function of the variation of the first clock over a time interval from an earlier calibration time.

8. The method of claim 3, further comprising selecting the calibration interval as a submultiple less than ¹⁄₁₀ of the separation intervals.

9. A device for calibrating a clock generator by aligning, at a plurality of calibration times, a frequency of a first clock with respect to a frequency of a second clock having a higher frequency accuracy than said first clock, the device comprising:
a real time clock (RTC) circuit coupled to the clock generator to receive the first clock from the clock generator; and
a microcontroller unit configured to compensate for an accumulation error in the RTC circuit by aligning the frequency of the first clock to an overcompensated frequency, wherein the overcompensated frequency is determined by adding a frequency offset to the frequency of the second clock to counter a variation in the frequency of the first clock, wherein the overcompensated frequency is different from the frequency of the second clock and wherein an average of the frequency of the first clock between calibration times is different than the frequency of the second clock while compensating for the accumulation error.

10. The device of claim 9, further comprising a clock generator coupled to the microcontroller unit and configured to generate a clock signal.

11. The device of claim 10, further comprising a control unit coupled to the RTC circuit and configured to wake-up a system.

12. A circuit comprising:
a first clock circuit;
a real time clock (RTC) hardware block coupled to the first clock circuit and configured to be coupled to a second clock circuit, the RTC hardware block configured to periodically generate a plurality of calibration signals, each calibration signal associated with a refresh time; and
an RTC circuit coupled to the first clock circuit and configured to receive each calibration signal;
wherein the RTC hardware block is configured to periodically produce each calibration signal by
enabling the second clock circuit for a calibration time after a start of the associated refresh time,
determining a first frequency of the first clock circuit,
determining a second frequency of the second clock circuit,
determining a first error based on a difference between the first frequency and the second frequency,
determining a first offset based on the first error to counter a variation in the first frequency of the first clock circuit, wherein the first offset plus the second frequency results in an overcompensated frequency, the overcompensated frequency being different than the second frequency,
producing each calibration signal based on the first error, the first offset, and the calibration time, and
disabling the second clock circuit for a remainder of the associated refresh time, wherein an average of the frequency of the first clock circuit between calibration signals is different than the second frequency while compensating for an accumulation error of the RTC hardware block.

13. The circuit of claim 12, wherein
the RTC circuit comprises a counter;
the counter is incremented based on received pulses of the first clock circuit; and
the RTC circuit adds or subtracts pulses from the received pulses of the first clock circuit based on each calibration signal.

14. The circuit of claim 12, wherein the refresh time is a multiple of the calibration time.

15. The circuit of claim 12, wherein the circuit further comprises the second clock circuit, the second clock circuit comprising a crystal.

16. The circuit of claim 12, wherein the first offset is further based on a third frequency of the first clock circuit determined in a previous calibration period.

17. The circuit of claim 16, wherein the RTC hardware block comprises a delta pulse counter block configured to measure a difference between a first number of pulses of the first clock circuit and a second number of pulses of the second clock circuit during the calibration time to produce the first error.

18. The circuit of claim 12, wherein producing each calibration signal is further based on a second offset, the second offset being based on a pre-defined frequency difference.

19. The method of claim 1, wherein the RTC circuit comprises a counter that is incremented based on received pulses of the first clock.

20. The method of claim 1, wherein aligning the frequency of the first clock with respect to the frequency of the second clock comprises:
counting, over a calibration time, a number of pulses of the first clock,
counting, over the calibration time, a number of pulses of the second clock,
calculating a difference between the number of pulses of the first clock and the number of pulses of the second clock, and
adding or subtracting pulses to the first clock based on the calculated difference.

21. The circuit of claim 12, wherein the calibration signal is calculated using a first function given by:

$$\text{cal}[k] = [fLSE(k) - fLSI(k)] * T\text{cal} - \Delta fLSI(k) * T\text{cal}/2$$

wherein cal[k] is the calibration signal at time k, fLSE(k) is the second frequency at time k, fLSI(k) is the first frequency at time k, Tcal is a calibration interval for performing a calibration, and $\Delta fLSI(k)$ is $fLSI(k) - fLSI(k-1)$.

* * * * *